(12) United States Patent
Kurczveil et al.

(10) Patent No.: US 11,177,631 B2
(45) Date of Patent: Nov. 16, 2021

(54) MULTI-WAVELENGTH SEMICONDUCTOR COMB LASERS

(71) Applicant: HEWLETT PACKARD ENTERPRISE DEVELOPMENT LP, Houston, TX (US)

(72) Inventors: Geza Kurczveil, Palo Alto, CA (US); Di Liang, Palo Alto, CA (US); Raymond G. Beausoleil, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/930,955

(22) Filed: May 13, 2020

(65) Prior Publication Data
US 2020/0274327 A1    Aug. 27, 2020

Related U.S. Application Data

(62) Division of application No. 15/483,678, filed on Apr. 10, 2017, now Pat. No. 10,680,407.

(51) Int. Cl.
*H01S 5/10* (2021.01)
*H01S 5/065* (2006.01)
(Continued)

(52) U.S. Cl.
CPC ............ *H01S 5/1032* (2013.01); *H01S 5/068* (2013.01); *H01S 5/0651* (2013.01);
(Continued)

(58) Field of Classification Search
CPC ....... H01S 5/1071; H01S 5/1028–1032; H01S 5/1096
See application file for complete search history.

(56) References Cited

U.S. PATENT DOCUMENTS

| 4,002,997 A * | 1/1977 | Thompson ............ H01S 5/1032 372/50.123 |
| 5,757,027 A | 5/1998 | Kuchta |

(Continued)

FOREIGN PATENT DOCUMENTS

| CN | 103843210 A | 6/2014 |
| EP | 2988378 A1 | 2/2016 |

(Continued)

OTHER PUBLICATIONS

Chang et al., "Optimization of Filtering Schemes for Broadband Astro-combs," Optics Express, vol. 20, No. 22, Oct. 17, 2012, p. 24987-25013.

(Continued)

*Primary Examiner* — Minsun O Harvey
*Assistant Examiner* — Sean P Hagan
(74) *Attorney, Agent, or Firm* — Hewlett Packard Enterprise Patent Department

(57) ABSTRACT

Examples disclosed herein relate to multi-wavelength semiconductor comb lasers. In some examples disclosed herein, a multi-wavelength semiconductor comb laser may include a waveguide included in an upper silicon layer of a silicon-on-insulator (SOI) substrate. The comb laser may include a quantum dot (QD) active gain region above the SOI substrate defining an active section in a laser cavity of the comb laser and a dispersion tuning section included in the laser cavity to tune total cavity dispersion of the comb laser.

6 Claims, 12 Drawing Sheets

(51) Int. Cl.
*H01S 5/068* (2006.01)
*H01S 5/14* (2006.01)
*H01S 5/02* (2006.01)
*H01S 5/026* (2006.01)
*H01S 3/106* (2006.01)
*H01S 5/34* (2006.01)

(52) U.S. Cl.
CPC .............. *H01S 5/1071* (2013.01); *H01S 5/14* (2013.01); *H01S 5/142* (2013.01); *H01S 3/106* (2013.01); *H01S 5/021* (2013.01); *H01S 5/026* (2013.01); *H01S 5/1014* (2013.01); *H01S 5/1039* (2013.01); *H01S 5/1096* (2013.01); *H01S 5/3412* (2013.01)

(56) References Cited

U.S. PATENT DOCUMENTS

| | | | |
|---|---|---|---|
| 6,040,590 | A | 3/2000 | OBrien et al. |
| 6,085,237 | A | 7/2000 | Durham et al. |
| 6,487,354 | B1 | 11/2002 | Ferm et al. |
| 6,704,792 | B1 | 3/2004 | Oswald |
| 6,734,105 | B2 | 5/2004 | Gweon |
| 6,774,448 | B1 | 8/2004 | Lindemann et al. |
| 6,902,987 | B1 | 6/2005 | Tong et al. |
| 7,244,679 | B2 | 7/2007 | Kwan-Ju |
| 7,257,283 | B1 | 8/2007 | Liu et al. |
| 7,561,605 | B1 | 7/2009 | Delfyett et al. |
| 7,565,084 | B1 | 7/2009 | Wach |
| 7,627,018 | B1 | 12/2009 | Guilfoyle et al. |
| 7,653,106 | B2 | 1/2010 | Arimoto |
| 7,873,992 | B1 | 1/2011 | Daily et al. |
| 7,935,956 | B2 | 5/2011 | Xie |
| 8,110,823 | B2 | 2/2012 | Bowers |
| 9,065,572 | B1 | 6/2015 | Wach |
| 9,110,219 | B1 | 8/2015 | Zhang et al. |
| 9,166,363 | B2 | 10/2015 | Jain |
| 9,209,596 | B1 | 12/2015 | Mclaurin et al. |
| 9,343,874 | B2 | 5/2016 | Liu et al. |
| 9,450,379 | B2 | 9/2016 | Zhang et al. |
| 9,494,734 | B1 | 11/2016 | Jain et al. |
| 9,509,122 | B1 | 11/2016 | Norberg et al. |
| 9,941,664 | B1 | 4/2018 | Hahn et al. |
| 2002/0040983 | A1 | 4/2002 | Fitzrgald |
| 2003/0023605 | A1 | 1/2003 | Sternin et al. |
| 2003/0081642 | A1 | 5/2003 | Hwang et al. |
| 2003/0086635 | A1 | 5/2003 | Bylsma et al. |
| 2004/0037342 | A1 | 2/2004 | Blauvelt et al. |
| 2004/0114641 | A1 | 6/2004 | Wise et al. |
| 2004/0247005 | A1 | 12/2004 | Schrodinger et al. |
| 2006/0039424 | A1 | 2/2006 | Thoma et al. |
| 2006/0153268 | A1* | 7/2006 | Yu ..................... G02B 6/12004 372/94 |
| 2007/0133632 | A1 | 6/2007 | Doerr |
| 2007/0170417 | A1 | 7/2007 | Bowers |
| 2008/0002929 | A1 | 1/2008 | Bowers et al. |
| 2008/0049802 | A1 | 2/2008 | Kim et al. |
| 2009/0032805 | A1 | 2/2009 | Ty et al. |
| 2009/0154517 | A1 | 6/2009 | Leem et al. |
| 2009/0245298 | A1 | 10/2009 | Sysak et al. |
| 2009/0245316 | A1 | 10/2009 | Sysak et al. |
| 2009/0274411 | A1 | 11/2009 | Bar et al. |
| 2010/0111128 | A1 | 5/2010 | Qin et al. |
| 2010/0142973 | A1 | 6/2010 | Gubenko et al. |
| 2011/0080090 | A1 | 4/2011 | Wood et al. |
| 2011/0134939 | A1 | 6/2011 | Zhang |
| 2011/0163421 | A1 | 7/2011 | Mi |
| 2011/0299561 | A1 | 12/2011 | Akiyama |
| 2012/0008658 | A1 | 1/2012 | Chung |
| 2012/0063484 | A1 | 3/2012 | Goddard et al. |
| 2012/0093456 | A1 | 4/2012 | Taillaert et al. |
| 2012/0189317 | A1 | 7/2012 | Heck et al. |
| 2012/0205352 | A1 | 8/2012 | Fermann |
| 2012/0300796 | A1 | 11/2012 | Sysak et al. |
| 2012/0320939 | A1 | 12/2012 | Baets et al. |
| 2013/0107901 | A1 | 5/2013 | Deppe |
| 2013/0143336 | A1 | 6/2013 | Jain |
| 2013/0182730 | A1 | 7/2013 | Fan et al. |
| 2013/0259077 | A1 | 10/2013 | Ben et al. |
| 2014/0264031 | A1 | 9/2014 | Fermann et al. |
| 2014/0363127 | A1 | 12/2014 | Baets et al. |
| 2015/0111325 | A1 | 4/2015 | Hsu et al. |
| 2015/0139264 | A1 | 5/2015 | Zhang et al. |
| 2015/0177458 | A1 | 6/2015 | Bowers et al. |
| 2015/0180201 | A1* | 6/2015 | Zhang ................... H01S 5/021 372/20 |
| 2015/0270684 | A1 | 9/2015 | Suzuki et al. |
| 2015/0333480 | A1 | 11/2015 | Santis et al. |
| 2016/0056612 | A1 | 2/2016 | Ferrotti et al. |
| 2016/0276807 | A1 | 9/2016 | Cai et al. |
| 2016/0334574 | A1 | 11/2016 | Czornomaz et al. |
| 2016/0356960 | A1 | 12/2016 | Novack et al. |
| 2017/0187161 | A1 | 6/2017 | Fermann et al. |
| 2017/0207600 | A1 | 7/2017 | Klamkin et al. |
| 2017/0212368 | A1 | 7/2017 | Liang et al. |
| 2017/0317471 | A1 | 11/2017 | Lor et al. |
| 2018/0026830 | A1 | 1/2018 | Bhatia et al. |
| 2018/0090576 | A1 | 3/2018 | Kim |
| 2018/0191134 | A1 | 7/2018 | Osinski et al. |

FOREIGN PATENT DOCUMENTS

| | | |
|---|---|---|
| KR | 10-2000-0055239 A | 9/2000 |
| KR | 10-2015-0097306 A | 8/2015 |
| WO | 2016/011002 A1 | 1/2016 |
| WO | 2016/018285 A1 | 2/2016 |

OTHER PUBLICATIONS

Delfyett et al., "Chirped pulse laser sources and applications", Progress in Quantum Electronics, vol. 36, Nov. 3, 2012, pp. 475-540.
International Search Report and Written Opinion received for PCT Application No. PCT/US18/53664, dated Feb. 28, 2019, 12 pages.
Liu et al., "Quantum Dot Lasers for Silicon Photonics" Photon. Res., vol. 3, No. 5, Oct. 2015, pp. B1-B9.
Moskalenko et al., "A Wide Bandwidth Coherent Optical Comb Source Based on a Monolithically Integrated Mode-Locked Ring Laser", Optical Fiber Communication Conference, Mar. 2014, 3 pages.
Tan et al., "Monolithic nonlinear pulse compressor on a silicon chip", Nature Communications, vol. 116, Nov. 16, 2010, pp. 1-6.
Tanabe et al., "High-Temperature 1.3 InAS/GaAs Quantum Dot Lasers on Si Substrates Fabricated by Wafer Bonding", The Japan Society of Applied PhysicsApplied Physics Express 6, Jul. 25, 2013, p. 082703-1-082703-4.
Tang et al., "Direct Integration of Quantum Dot Lasers on Silicon," (Research Paper), 18th European Conference on Integrated Optics 2016, May 18-20, 2016, 2 pages.
Wang Ting., "High-performance III-V quantum-dot lasers monolithically grown on Si and Ge substrates for Si photonics," (Research Paper), University College of London, Feb. 2012, 160 pages.
Wing et al., "Improvement of Plasmonic Enhancement of Quantum Dot Emission via an Intermediate Silicon-aluminum Oxide Interface", Applied Physics Letters 106, 2015, p. 013105-1-013105-4.
Wordpress, "SnmpSharpNet", SNMP Library for C#: Project Updates, available online at <https://web.archive.org/web/20190628224156/http://www.snmpsharpnet.com/?page_id=160&paged=2>, Jun. 28, 2019, 8 pages.
Zhang et al., "Silicon waveguide with four zero-dispersion wavelengths and its application in on-chip octave-spanning supercontinuum generation", Optics Express, vol. 20, Issue 2, 2012, pp. 1685-1690.
Zhu et al., Ultrabroadband flat dispersion tailoring of dual-slot silicon waveguides, Optics Express, vol. 20, Issue 14, 2012, p. 15899-15907.
Resan et al., "Dispersion-Managed Breathing-Mode Semiconductor Mode-Locked Ring Laser: Experimental Characterization and Numeri-

(56) References Cited

OTHER PUBLICATIONS cal Simulations", IEEE Journal of Quantum Electronics, vol. 40, Issue 3, Mar. 2004, pp. 214-221.

* cited by examiner

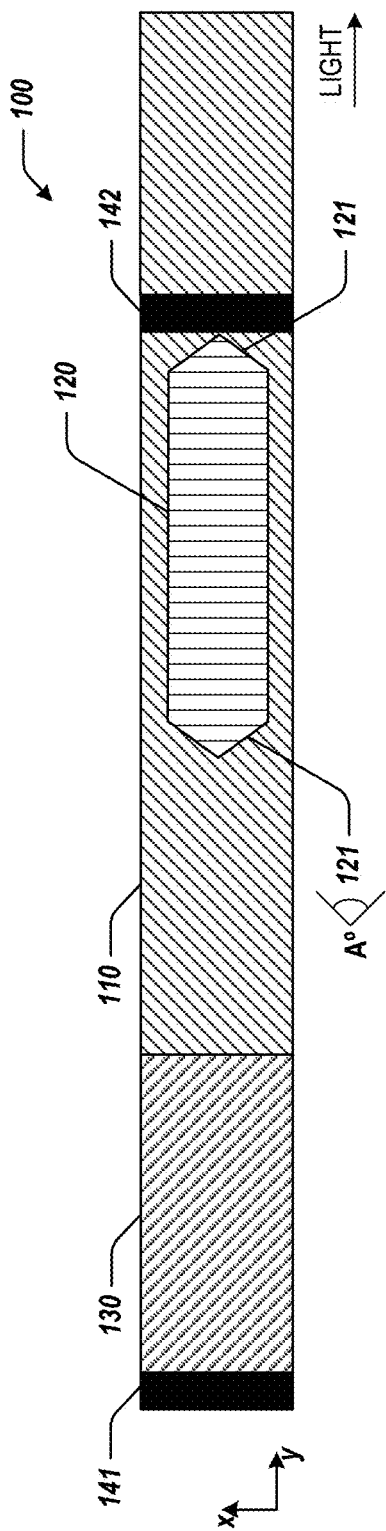
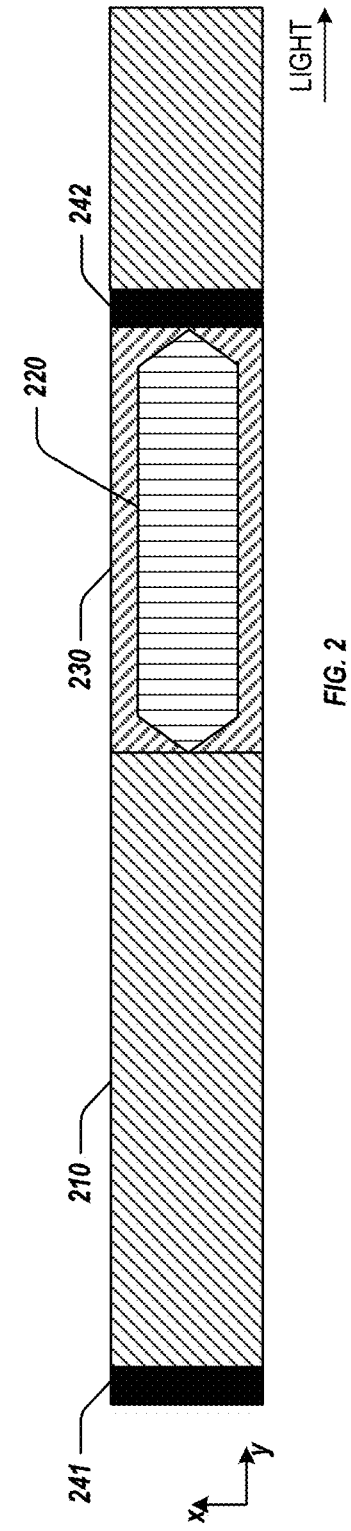
FIG. 1
FIG. 2

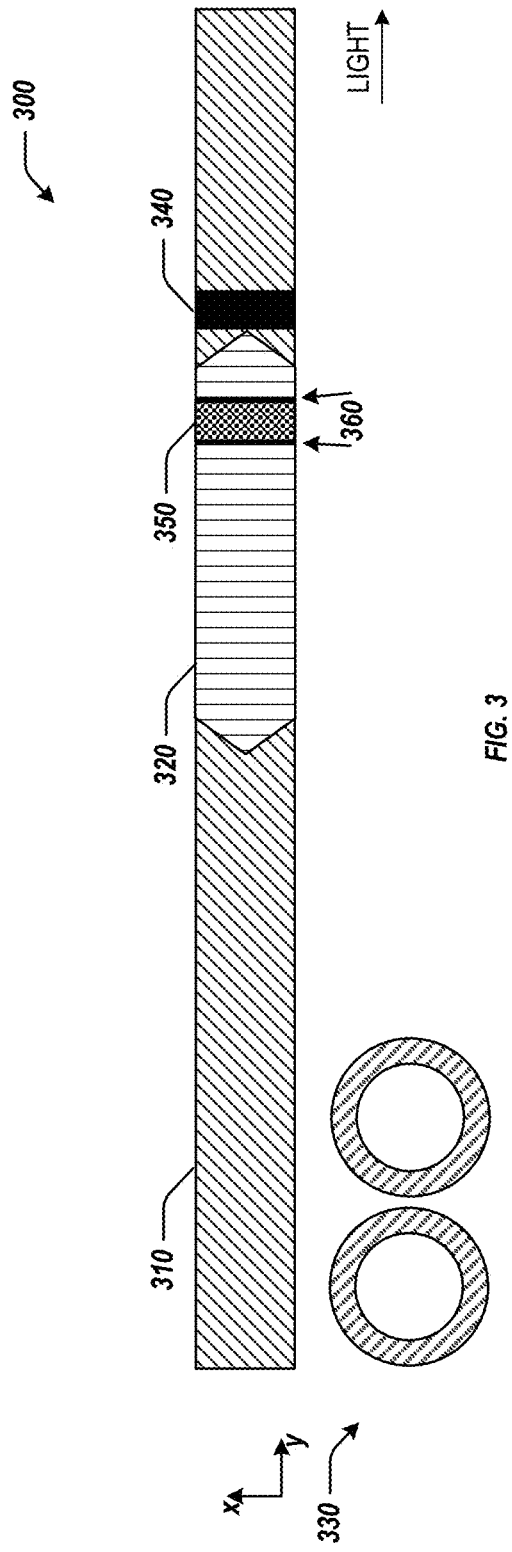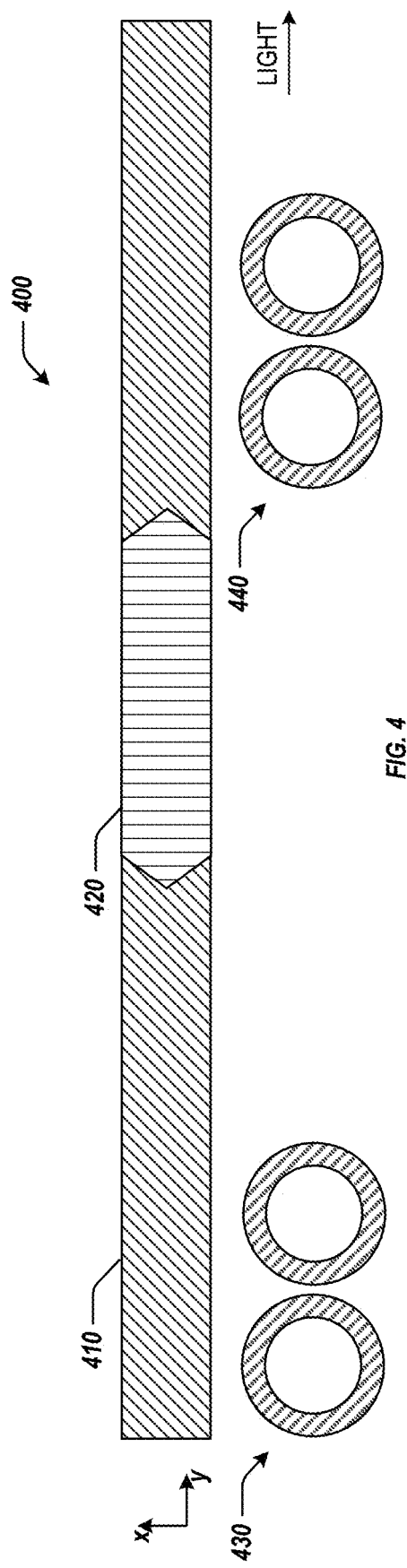

MULTI-WAVELENGTH SEMICONDUCTOR COMB LASERS

CROSS-REFERENCE TO RELATED APPLICATIONS

This application is a divisional application of and claims priority to application No. 15/483,678, filed on Apr. 10, 2017, the contents of which are hereby incorporated by reference in their entireties.

STATEMENT OF GOVERNMENT INTEREST

This invention was made with government support under Contract No. H98230-14-30011, awarded by Maryland Procurement Office. The government has certain rights in the invention.

BACKGROUND

Semiconductor lasers based on quantum dot (QD) gain material are attractive candidates for multi-wavelength comb lasers due to their low relative intensity noise compared to quantum well-based lasers.

BRIEF DESCRIPTION OF THE DRAWINGS

The following detailed description references the drawings, wherein:

FIG. 1 is an illustration depicting a top-down view of an example multi-wavelength semiconductor comb laser;

FIG. 2 is an illustration depicting a top-down view of an example multi-wavelength semiconductor comb laser;

FIG. 3 is an illustration depicting a top-down view of an example multi-wavelength semiconductor comb laser;

FIG. 4 is an illustration depicting a top-down view of an example multi-wavelength semiconductor comb laser;

DETAILED DESCRIPTION

Figure 5:
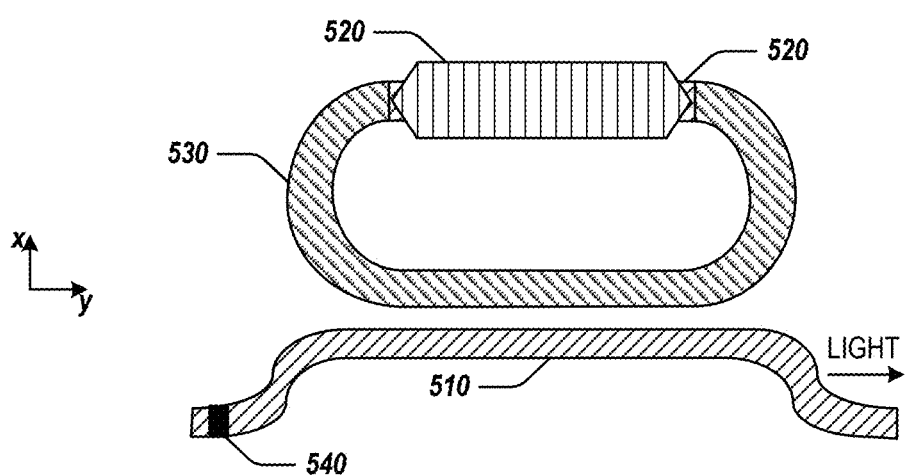
FIG. 5 is an illustration depicting a top-down view of an example multi-wavelength semiconductor comb laser.

The following detailed description refers to the accompanying drawings. Wherever possible, the same reference numbers are used in the drawings and the following description to refer to the same or similar parts. It is to be expressly understood that the drawings are for the purpose of illustration and description only. The number and arrangement of the components illustrated in the drawings is an example only, and other arrangements and numbers of components may be utilized without departing from the examples of the present disclosure. Moreover, while several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Total cavity dispersion (TCD) of a comb laser may directly affect the spacing between individual comb lines (i.e., comb width) of the laser. A laser may include a laser cavity comprising components such as a gain region, passive waveguide, and two mirrors. The TCD of the laser may be determined as a sum of the dispersion of each component in the laser cavity multiplied by its length:

$$TCD = L_{gain}D_{gain} + L_{pas}D_{pas} + L_{M1}D_{M1} + L_{M2}D_{M2} \qquad (i)$$

where $L_{gain}$ and $D_{gain}$ are the length and dispersion of the active section of the laser cavity, $L_{pas}$ and $D_{pas}$ are the length and dispersion of the passive section of the laser cavity, $L_{M1}$ and $D_{M1}$ are the length and dispersion of the first mirror, and $L_{M2}$ and $D_{M2}$ are the length and dispersion of the second mirror.

Dispersion (D) can be broken up into two components—material dispersion and waveguide dispersion. The material dispersion (i.e., group velocity dispersion) for most high refractive index waveguide materials has a positive value in the wavelength range of interest (e.g., 1.3 to 1.6 μm). As a result, if the TCD of the laser cavity is too large for broad comb operation there is no easy way to reduce TCD because the only free parameters are the lengths of the individual components, and they too are positive. Moreover, adjusting the waveguide dispersion of waveguides, such as rib waveguides, using small dimensions (e.g., waveguide widths less than 400 nm) may result in large optical loss that could prevent the laser from lasing.

Examples disclosed herein provide multi-wavelength semiconductor comb lasers fabricated on silicon-on-insulator (SOI) substrates. The example multi-wavelength semiconductor lasers disclosed herein are capable of tuning TCD to desired values in order to achieve maximal comb width by incorporating a dispersion tuning section into the laser. The dispersion tuning section may be a slot waveguide formed by a lower waveguide rail in a SOI substrate, a waveguide slot in a dielectric layer, and an upper waveguide rail in a cladding layer. The TCD of the laser may be tuned by tuning the material dispersion of the dispersion tuning section through the selection of an appropriate cladding material. Moreover, various dimensional parameters of the dispersion tuning section may be selected to adjust the waveguide dispersion of dispersion tuning section, thereby tuning the TCD of the laser. The slot waveguide of the dispersion tuning section may be fabricated using fast and inexpensive deep UV (DUV) lithography processes.

FIG. 1 is an illustration depicting a top-down view of an example multi-wavelength semiconductor comb laser 100. As shown in FIG. 1, comb laser 100 may include various components, such as a waveguide 110 included in an upper silicon layer of a SOI substrate, a QD layer 120, a dispersion tuning section 130, and a plurality of mirrors 141 and 142.

As shown in FIG. 1, mirrors 141 and 142 may be positioned at opposite ends of comb laser 100 along the length (y-axis) of comb laser 100. The area of comb laser 100 between mirrors 141 and 142 may define the laser cavity of comb laser 100. Mirrors 141 and 142 may be used for optical feedback to reflect light in waveguide 110. Mirrors 141 and 142 may be implemented as distributed Bragg reflectors, loop mirrors, reflective multimode interference (MMI) couplers, sidewall gratings, or a combination thereof. Mirrors 141 and 142 may be designed such that they have low loss and broad reflection bandwidth. In some implementations, mirror 141 may have greater reflectivity than mirror 142 to ensure that light primarily travels in one direction (e.g., left to right as illustrated in FIG. 1). Example reflectivity of mirror 141 may range from about 90% reflectivity or greater while example reflectivity of mirror 142 may range from about 10%-70% reflectivity.

QD layer 120 may be a mesa structure formed using various III-V QD materials, such as InAs, InGaAs, GaAs, InP, InGaP, InGaAsP, etc. The QD material may comprise quantum dots, or nanoscale semiconductor particles, capable of generating a plurality of optical wavelengths (also referred to as comb lines). QD layer 120 may be an active gain region above the SOI substrate of comb laser 100 that generates light. The active gain region may define the active section of the laser cavity of comb laser 100. The area outside of the active section of the laser cavity may be referred to as the passive section of the laser cavity.

QD layer 120 may include a junction 121 at each end of QD layer 120. In some implementations, at least one of junctions 121 may be tapered junctions such as those shown in FIG. 1. The taper angle A° may be, for example, between 1°-179. In some implementations, at least one of junctions 121 may be an angled junction.

Waveguide 110 may be used to guide the propagation of light generated in the active region of QD layer 120. In order for comb laser 100 to produce a laser output, light generated in the active region of QD layer 120 may be coupled to waveguide 110 in the upper silicon layer of the SOI substrate. A mode converter (not shown) included in waveguide 110 may facilitate optical coupling of lasing modes (i.e., the light generated in the active region) to waveguide 110.

Dispersion tuning section 130 may be included in the laser cavity of comb laser 100 to tune TCD of comb laser 100 to desired values in order to achieve maximal comb width (i.e., comb spacing). As shown in FIG. 1, dispersion tuning section 130 may be positioned in the passive section of the laser cavity near mirror 141. With the inclusion of dispersion tuning section 130, the TCD of comb laser 100 becomes:

$$\text{TCD} = L_{gain}D_{gain} + L_{pas}D_{pas} + L_{M1}D_{M1} + L_{M2}D_{M2} + L_{DT}D_{DT} \quad \text{(ii)}$$

where $L_{gain}$ and $D_{gain}$ are the length and dispersion of the active section of the laser cavity, $L_{pas}$ and $D_{pas}$ are the length and dispersion of the passive section of the laser cavity, $L_{M1}$ and $D_{M1}$ are the length and dispersion of the mirror 141, $L_{M2}$ and $D_{M2}$ are the length and dispersion of the mirror 142, and $L_{DT}$ and $D_{DT}$ are the length and dispersion of dispersion tuning section 130. Thus, the TCD of comb laser 100 may be tuned by adjusting the length and/or dispersion of dispersion tuning section 130.

FIG. 2 is an illustration depicting a top-down view of an example multi-wavelength semiconductor comb laser 200. Comb laser 200 may include various components similar to those included in comb laser 100 of FIG. 1, such as a waveguide 210 included in an upper silicon layer of a SOI substrate, a QD layer 220, a dispersion tuning section 230, and a plurality of mirrors 241 and 242. However, comb laser 200 may include dispersion tuning section 230 in the active section of comb laser 200's laser cavity as opposed to the passive section. That is, dispersion tuning section 230 may be positioned under QD layer 200 near mirror 242.

FIG. 3 is an illustration depicting a top-down view of an example multi-wavelength semiconductor comb laser 300. Comb laser 300 may include various components similar to those included in comb laser 100 of FIG. 1 and comb laser 200 of FIG. 2, such as a waveguide 310 included in an upper silicon layer of a SOI substrate, a QD layer 320, and a mirror 340. However, instead of a mirror at the beginning (i.e., left side) of the laser cavity, comb laser 300 may include a pair of coupled rings 330 that function as both the reflector at the beginning of the laser cavity as well as the dispersion tuning section. Moreover, comb laser 300 may include a saturable absorber (SA) 350. It is to be noted that a SA similar to SA 350 may be incorporated into any of the comb lasers disclosed herein.

SA 350 may be a reverse-biased or unbiased portion of gain material of the active gain region included in QD layer 320. SA 350 may be electrically isolated from the remainder of QD layer 520 by electrical isolation 360 such that SA 350 and QD layer 320 may be independently biased. Electrical isolation 360 may be implemented by etching and/or implantation of a portion of an upper cladding surrounding (not shown) SA 350.

SA 350 may be used to reduce amplitude noise of comb laser 300 and to manipulate the temporal behavior of laser 300. For example, the bias voltage of SA 350 may be manipulated to change the recovery time of SA 350. Changes in recovery time of SA 350 may, in turn, be used to adjust the phase relationships between the multiple wavelengths of light oscillating in the laser cavity of comb laser 300. Accordingly, the phase relationships the multiple wavelengths of light oscillating in the laser cavity of comb laser 300 may be adjusted such that laser 300 may temporarily operate in a mode-locked regime based on the applied bias voltage.

FIG. 4 is an illustration depicting a top-down view of an example multi-wavelength semiconductor comb laser 400. Comb laser 400 may include various components similar to those included in comb laser 300 of FIG. 3, such as a waveguide 410 included in an upper silicon layer of a SOI substrate, a QD layer 420, and a pair of coupled rings 430 that function as both the reflector at the beginning of the laser cavity as well as a dispersion tuning section. However, instead of a mirror at the and (i.e., right side) of the laser cavity, comb laser 400 may include a second pair of coupled rings 430 that function as both the reflector at the end of the laser cavity as well as a second dispersion tuning section.

FIG. 5 is an illustration depicting a top-down view of an example multi-wavelength semiconductor comb laser 500. Comb laser 500 may include various components, such as a first waveguide 510 and a second waveguide 550 included in an upper silicon layer of a SOI substrate, a QD layer 520, a dispersion tuning section 530, and a mirrors 540.

As shown in FIG. 5, comb laser 500 may be a ring laser. QD layer, 520, dispersion tuning section 530, and second waveguide 550 may be oval-shaped or racetrack-shaped and may be a traveling wave cavity for light generated by QD layer 520. In order to get light out of the ring, first waveguide 510 may be positioned next to the ring. First waveguide 510 may include mirror 540 to ensure that light travels primarily in one direction (e.g., left to right) in first waveguide 510. As light travels around the ring, a portion of the traveling light may leak out into first waveguide 510, the amount of which depends on the proximity of first waveguide 510 to the ring. The closer first waveguide 510 is to the ring, the greater the amount of light will to leak from the ring to first waveguide 510.

Figure 6A:
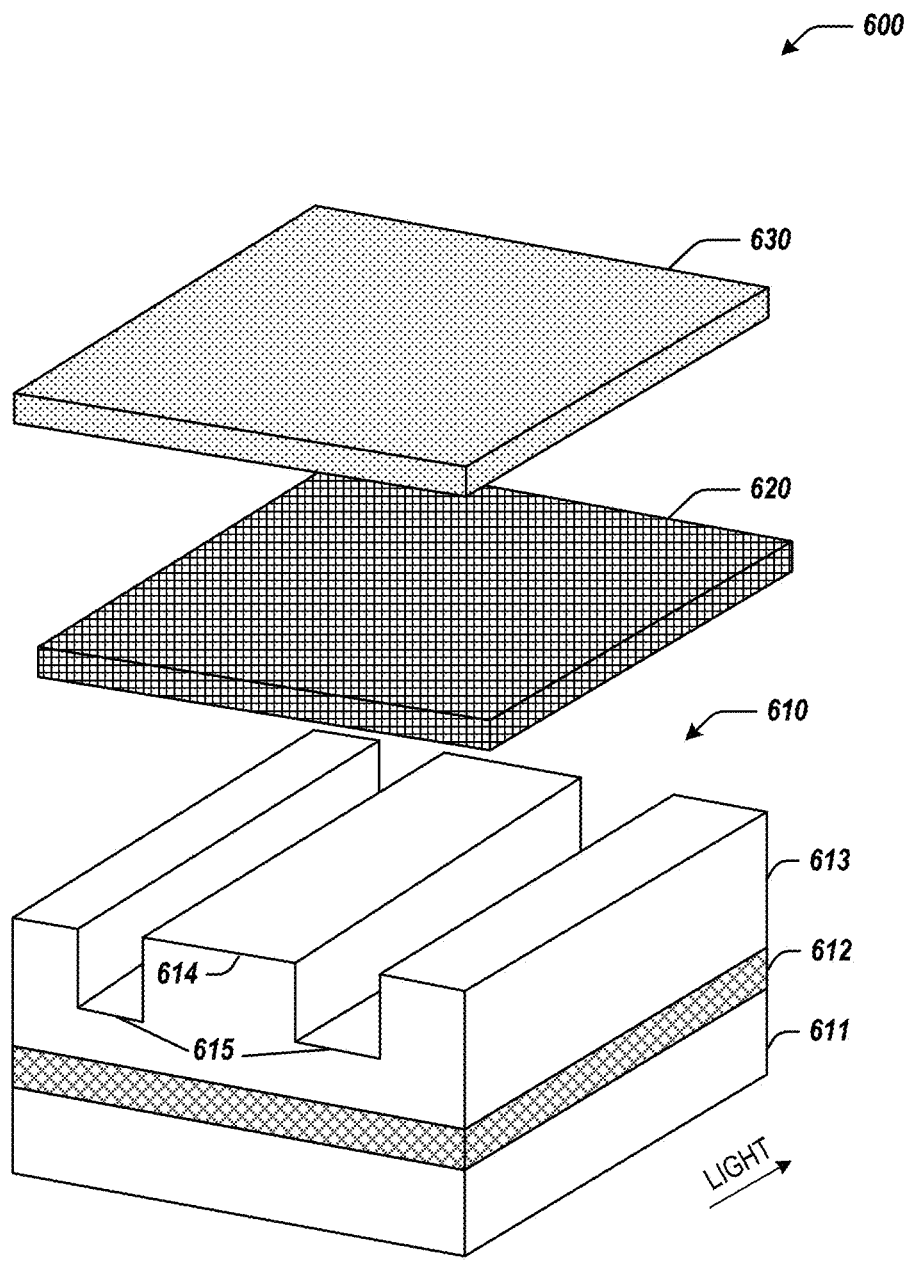
FIGS. 6(a)-6(c) are illustrations depicting an example dispersion tuning section.
Figure 6B:
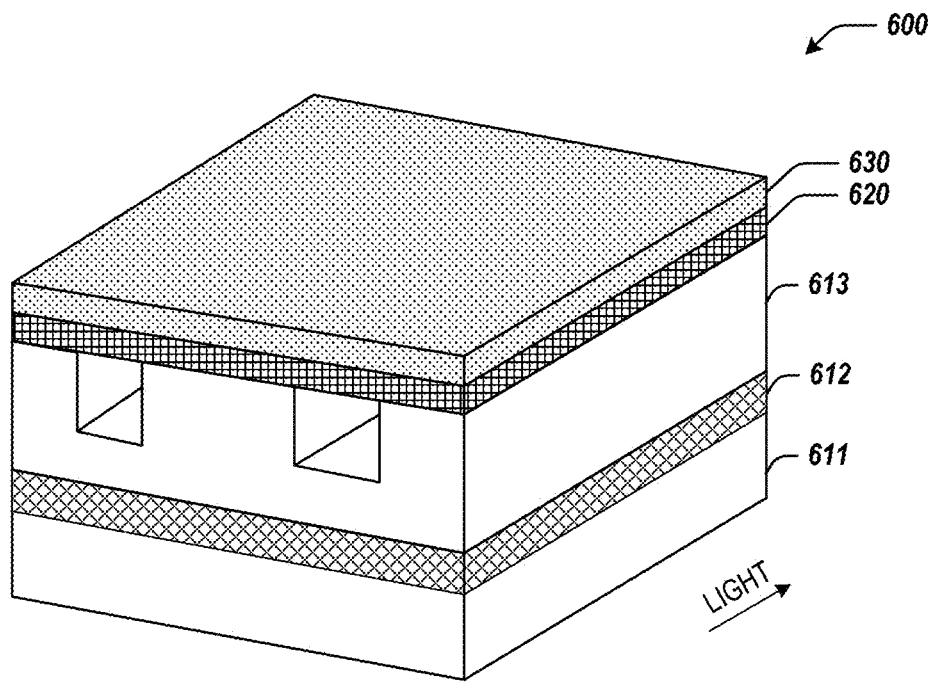
Figure 6C:
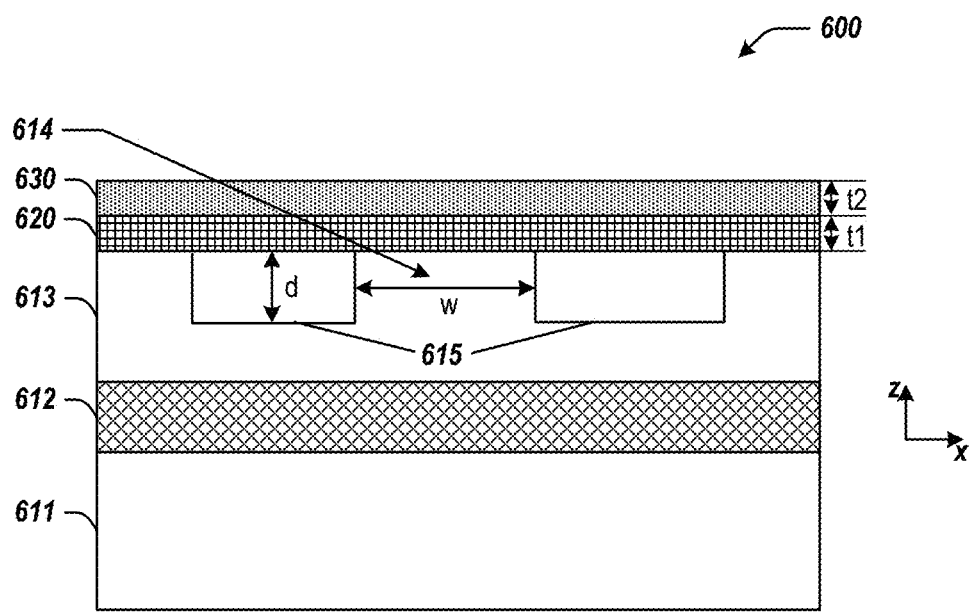

FIGS. 6(a)-6(c) are illustrations depicting an example dispersion tuning section 600. In some implementations, dispersion tuning section 300 may be used to implement dispersion tuning section 130 of FIG. 1, dispersion tuning section 330 of FIG. 3, dispersion tuning sections 430 and 440 of FIG. 4, and dispersion tuning section 550 of FIG. 5. FIG. 6(a) is an illustration of an exploded perspective view of dispersion tuning section 600, FIG. 6(b) is an illustration of an assembled perspective view of dispersion tuning section 600, and FIG. 6(c) is an illustration of a cross-sectional view of dispersion tuning section 600. As shown in FIGS. 6(a)-6(c), dispersion tuning section 600 may include a SOI substrate 610, a dielectric layer 620, and a cladding layer 630.

In some implementations, dispersion tuning section 600 may include a waveguide. In one implementation the waveguide may be a rib waveguide. However, the rib waveguide would need small dimensions (e.g., a rib width of less than 400 nm) in order to significantly change the waveguide dispersion of the rib waveguide (and thus the TCD of a comb laser in which dispersion tuning section 600 is included). At such small dimensions, the optical loss becomes prohibitively large and could prevent the comb laser from lasing.

Instead of using a rib waveguide, dispersion tuning section 600 may be formed to include a slot waveguide. In the example illustrated in FIGS. 6(a)-6(c), dispersion tuning section 600 may include a vertical slot waveguide (i.e., a slot waveguide where the low refractive index slot of the waveguide is stacked above a high refractive index lower rail and below a high refractive index upper rail).

As shown in FIGS. 6(a)-6(c), layers 611, 612, and 613 may make up SOI substrate 610, wherein layer 611 is a bottom silicon layer, layer 612 is a buried oxide (BOX) layer (e.g., $SiO_2$), and layer 613 is an upper silicon layer. A lower rail 614 may be formed in upper silicon layer 613 between two airgaps 615. Lower rail 614 may be formed by etching airgaps 615 into upper silicon layer 613. While lower rail 614 is shown in FIG. 6(a) as being formed of silicon, lower rail 614 may be formed of other high refractive index materials.

Dielectric layer 620 and cladding layer 630 may be planarized and wafer bonded to SOI substrate 610 to ensure that the interfaces between the high refractive index layers and the low refractive index layer are smooth to reduce optical losses from scattering caused by rough surfaces. Dielectric layer 620 may comprise a low refractive index material whereas cladding layer 630 may comprise a high refractive index III-V semiconductor material such as AlGaAs or GaAs. Light may travel through the slot waveguide, being mostly confined within dielectric layer 620.

Dispersion tuning section 600 may be used to tune TCD in various ways. In one technique, material dispersion of dispersion tuning section 600 may be tuned by selecting different materials for cladding layer 630. In another technique, waveguide dispersion may be tuned by adjusting various parameters of dispersion tuning section 600. In some implementations, one or a combination of techniques may be used to tune TCD.

FIG. 6(c) illustrates various parameters of dispersion tuning section 300 that may be adjusted in order to tune TCD. The parameters may include, for example, the depth d of airgaps 615, the width w of lower rail 614, the thickness t1 of dielectric layer 620, and the thickness t2 of cladding layer 630. One or a combination of these parameters may be adjusted to tune TCD.

Figure 7A:
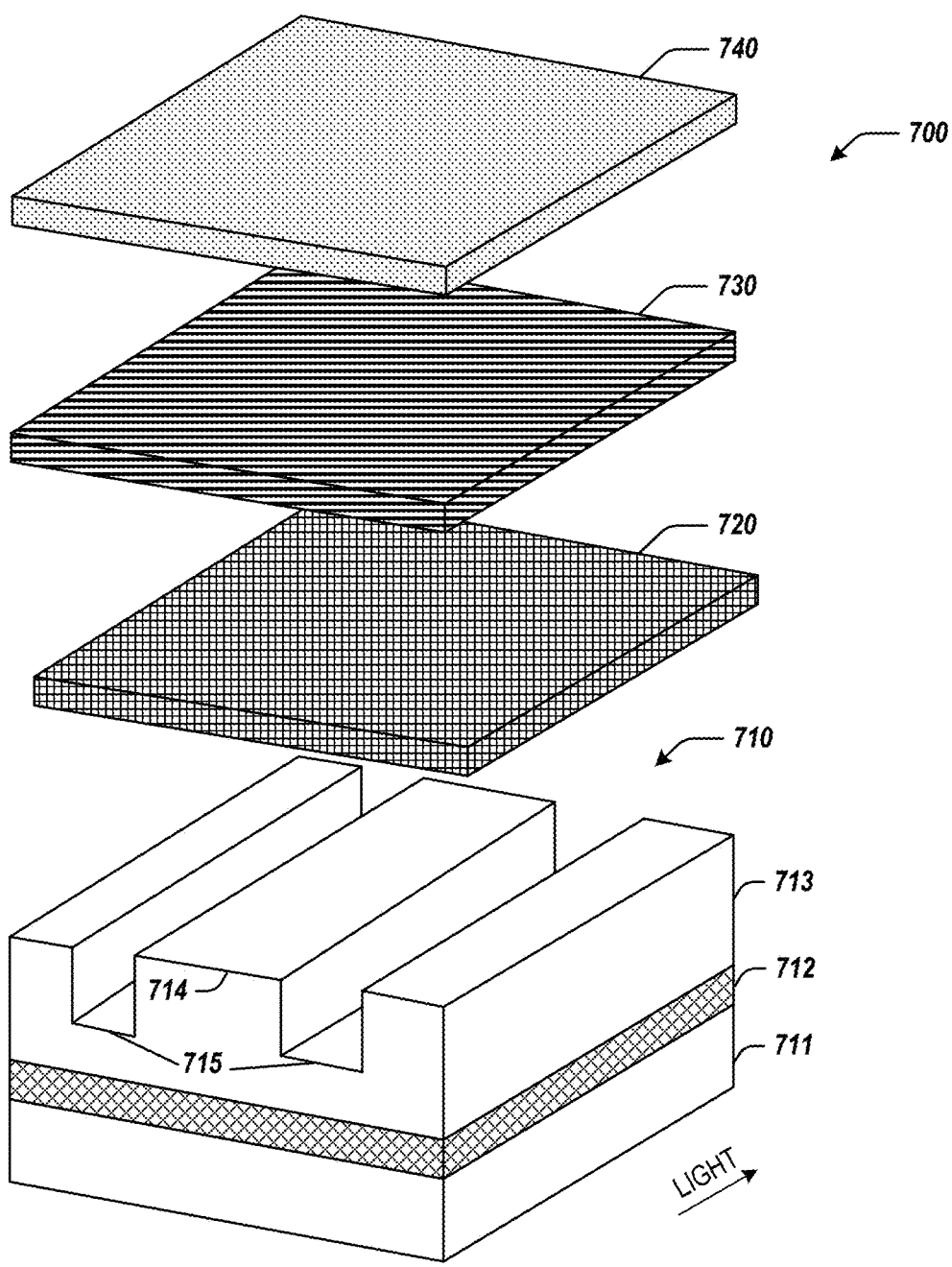
FIGS. 7(a)-7(c) are illustrations depicting an example dispersion tuning section.
Figure 7B:
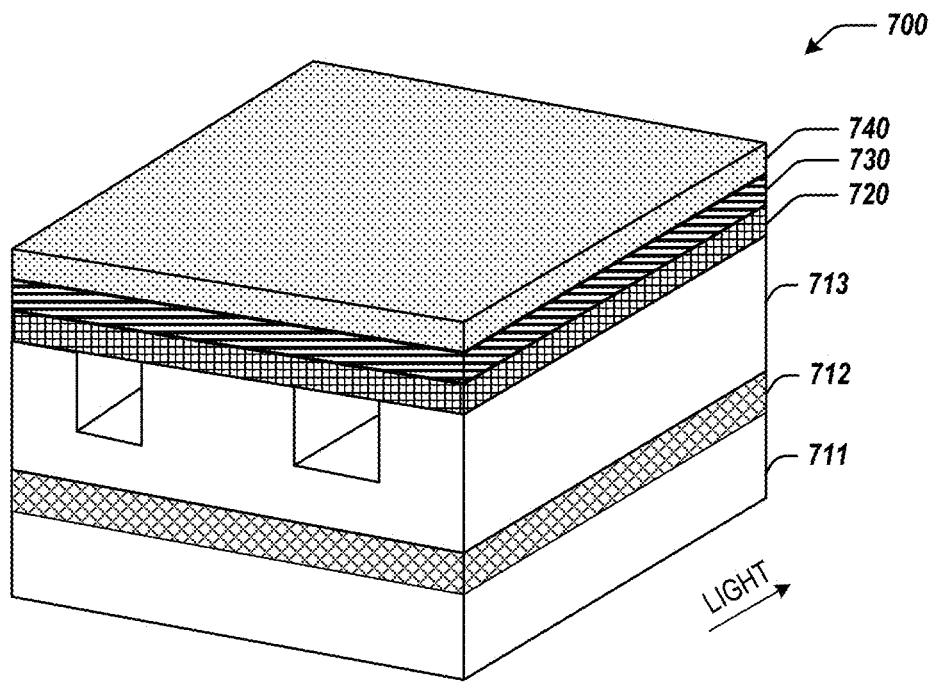
Figure 7C:
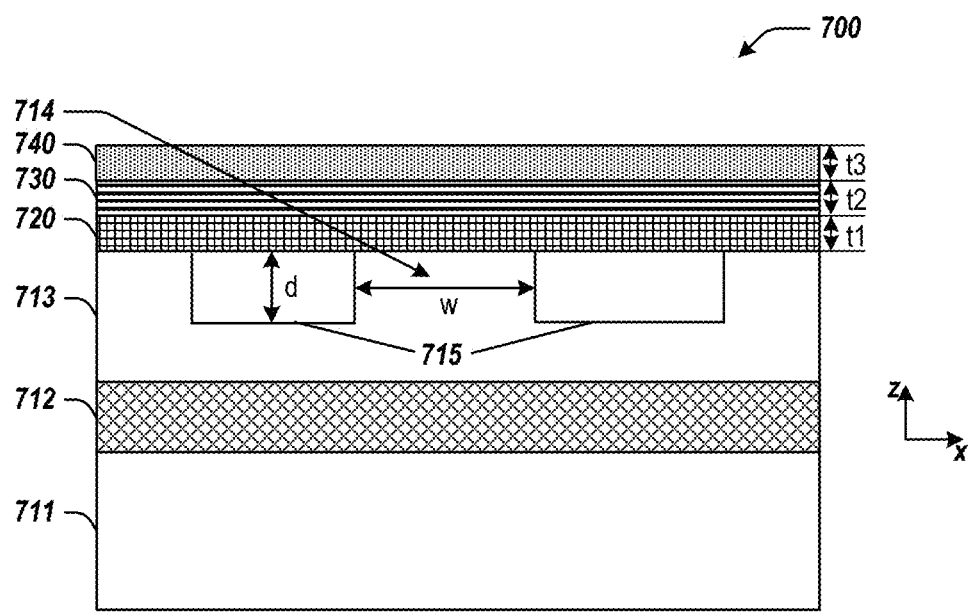

FIGS. 7(a)-7(c) are illustrations depicting an example dispersion tuning section 700. In some implementations, dispersion tuning section 700 may be used to implement dispersion tuning section 130 of FIG. 1, dispersion tuning section 330 of FIG. 3, dispersion tuning sections 430 and 440 of FIG. 4, and dispersion tuning section 550 of FIG. 5. FIG. 7(a) is an illustration of an exploded perspective view of dispersion tuning section 700, FIG. 7(b) is an illustration of an assembled perspective view of dispersion tuning section 700, and FIG. 7(c) is an illustration of a cross-sectional view of dispersion tuning section 700. As shown in FIGS. 7(a)-7(c), dispersion tuning section 700 may include a SOI substrate 710, a dielectric layer 720, an oxide layer 730, and an epitaxial silicon layer 740.

Dispersion tuning section 700 may be formed to include a slot waveguide. In the example illustrated in FIGS. 7(a)-7(c), dispersion tuning section 700 may include a vertical slot waveguide. As shown in FIGS. 7(a)-7(c), layers 711, 712, and 713 may make up SOI substrate 710, wherein layer 711 is a bottom silicon layer, layer 712 is a buried oxide (BOX) layer (e.g., $SiO_2$), and layer 713 is an upper silicon layer. A lower rail 714 may be formed in upper silicon layer 713 between two airgaps 715. Lower rail 714 may be formed by etching airgaps 715 into upper silicon layer 713. While lower rail 714 is shown in FIG. 7(a) as being formed of silicon, lower rail 714 may be formed of other high refractive index materials.

Oxide layer 730 (e.g., $SiO_2$) may be formed on epitaxial silicon layer 740 via various techniques such as oxidation or deposition. Dielectric layer 720 may be formed on oxide layer 730 using various deposition techniques. Dielectric layer 720, oxide layer 730, and epitaxial silicon layer 740 may be planarized and wafer bonded to SOI substrate 710 to ensure that the interfaces between the high refractive index layers and the low refractive index layer are smooth to reduce optical losses from scattering caused by rough surfaces. Dielectric layer 720 may comprise a low refractive index material. Light may travel through the slot waveguide, being mostly confined within dielectric layer 720 and oxide layer 730.

Dispersion tuning section 700 may be used to tune TCD by adjusting various parameters of dispersion tuning section 700. FIG. 7(c) illustrates various parameters of dispersion tuning section 700 that may be adjusted in order to tune TCD. The parameters may include, for example, the depth d of airgaps 715, the width w of lower rail 714, the thickness t1 of dielectric layer 720, the thickness t2 of oxide layer 730, and the thickness t3 of epitaxial silicon layer 740. One or a combination of these parameters may be adjusted to tune TCD.

Figure 8A:
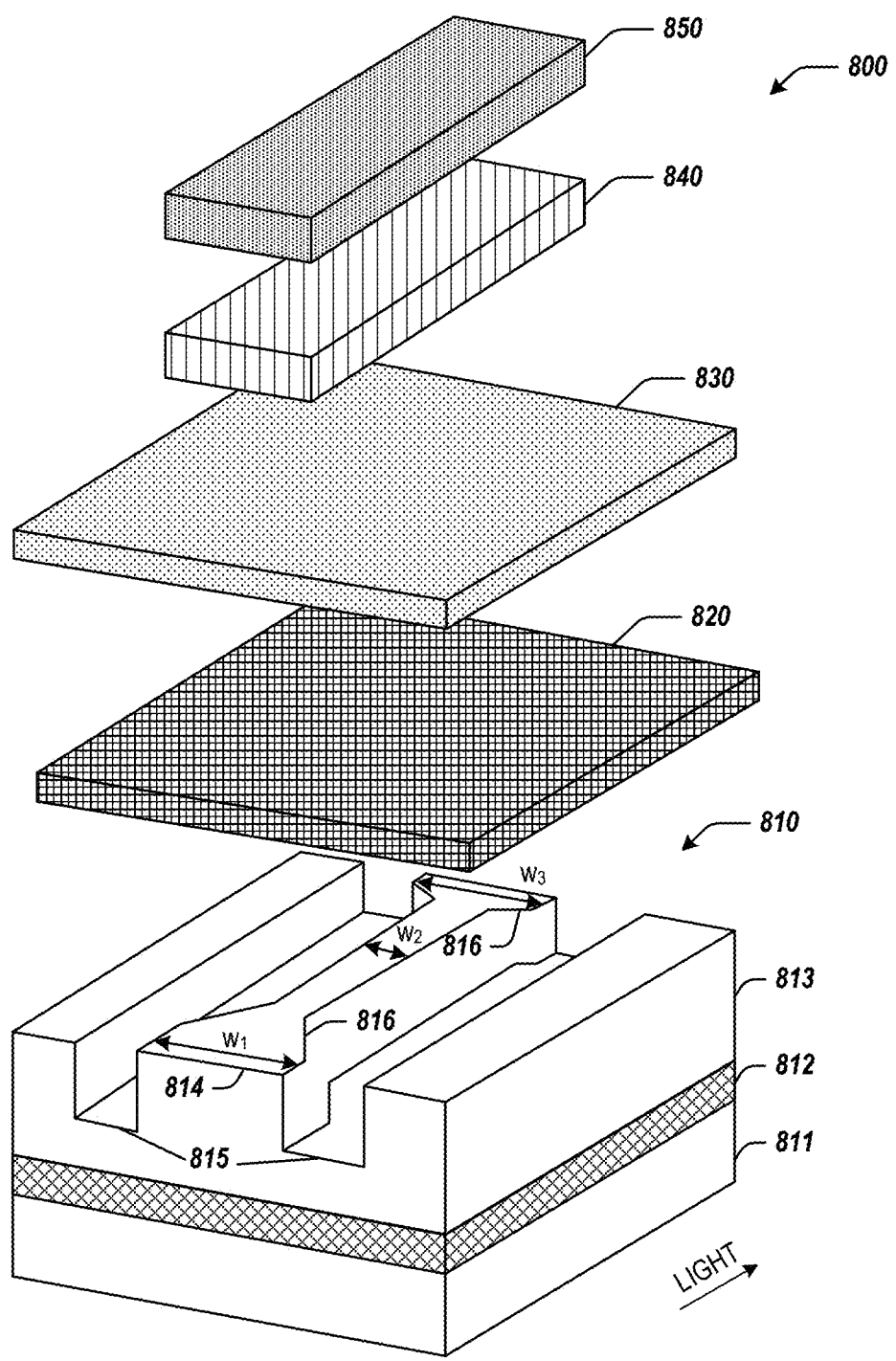
FIGS. 8(a)-8(c) are illustrations depicting an example dispersion tuning section.
Figure 8B:
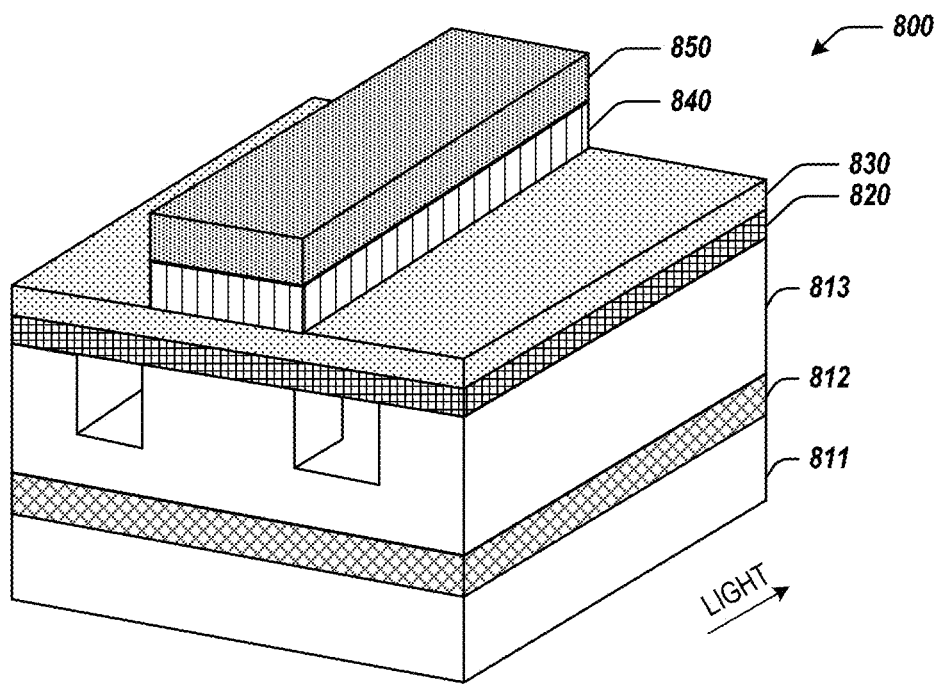
Figure 8C:
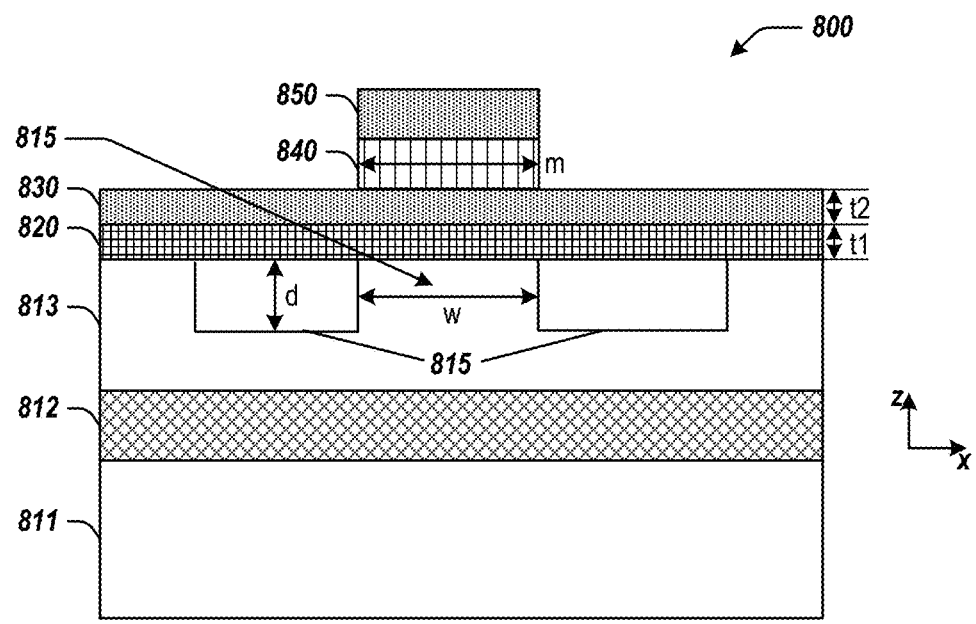

FIGS. 8(a)-8(c) are illustrations depicting an example dispersion tuning section 800. In some implementations, dispersion tuning section 800 may be used to implement dispersion tuning section 230 of FIG. 2. FIG. 8(a) is an illustration of an exploded perspective view of dispersion tuning section 800, FIG. 8(b) is an illustration of an assembled perspective view of dispersion tuning section 800, and FIG. 8(c) is an illustration of a cross-sectional view of dispersion tuning section 800. As shown in FIGS. 8(a)-8(c), dispersion tuning section 800 may include a SOI substrate 810, a dielectric layer 820, a lower cladding layer 830, a QD layer 840 (e.g., QD layer 220 of FIG. 2) of a comb laser (e.g., comb laser 200 of FIG. 2), and an upper cladding layer 840.

Dispersion tuning section 800 may be formed to include a slot waveguide. In the example illustrated in FIGS. 8(a)-8(c), dispersion tuning section 800 may include a vertical slot waveguide. As shown in FIGS. 8(a)-8(c), layers 811, 812, and 813 may make up SOI substrate 810, wherein layer 811 is a bottom silicon layer, layer 812 is a buried oxide (BOX) layer (e.g., $SiO_2$), and layer 813 is an upper silicon layer. A lower rail 814 may be formed in upper silicon layer 813 between two airgaps 815. Lower rail 814 may be formed by etching airgaps 815 into upper silicon layer 813. While lower rail 814 is shown in FIG. 5(a) as being formed of silicon, lower rail 814 may be formed of other high refractive index materials.

Lower rail 814 may be made up of various widths, such as width $W_1$, width $W_2$, and width $W_3$, along the length of lower rail 814. In some implementations, width $W_1$ and $W_3$ may be greater than width $W_2$ while in other implementations width $W_1$ and $W_3$ may be less than width $W_2$. The tapers between width $W_1$ and width $W_2$, and between width $W_2$ width $W_3$, may be implemented by a pair of mode converters 816. Mode converters 816 may facilitate optical coupling of lasing modes (i.e., the light generated in QD layer 840) between QD layer 840 and the slot waveguide. The optical coupling may be achieved as a result of the taper of mode converters 814.

The slot of the slot waveguide may be formed in dielectric layer 820. Dielectric layer 820 may comprise a low refractive index material. The upper rail of the slot waveguide may include the III-V stack of lower cladding layer 830, QD layer 840, and upper cladding layer 850. Lower cladding layer 830, QD layer 840, and upper cladding layer 850 may comprise various high refractive index III-V semiconductor materials. Dielectric layer 820, lower cladding layer 830, QD layer 840, and upper cladding layer 850 may be planarized and wafer bonded to SOI substrate 810 to ensure that the interfaces between the high refractive index layers and the low refractive index layer are smooth to reduce optical losses from scattering caused by rough surfaces. QD layer 840 and upper cladding layer 850 may be etched for form the mesa structure. Light may travel through the slot waveguide, being mostly confined within dielectric layer 820.

Dispersion tuning section 800 may be used to tune TCD by adjusting various parameters of dispersion tuning section 800. FIG. 8(c) illustrates various parameters of dispersion tuning section 800 that may be adjusted in order to tune TCD. The parameters may include, for example, the depth d of airgaps 815, the width w of lower rail 814, the thickness t1 of dielectric layer 820, the thickness t2 of lower cladding layer 830, and the width m of QD layer 840. One or a combination of these parameters may be adjusted to tune TCD. Adjusting the width w of lower rail 814 may include adjusting any one or a combination of width $W_1$, width $W_2$, and width $W_3$.

Figure 9:
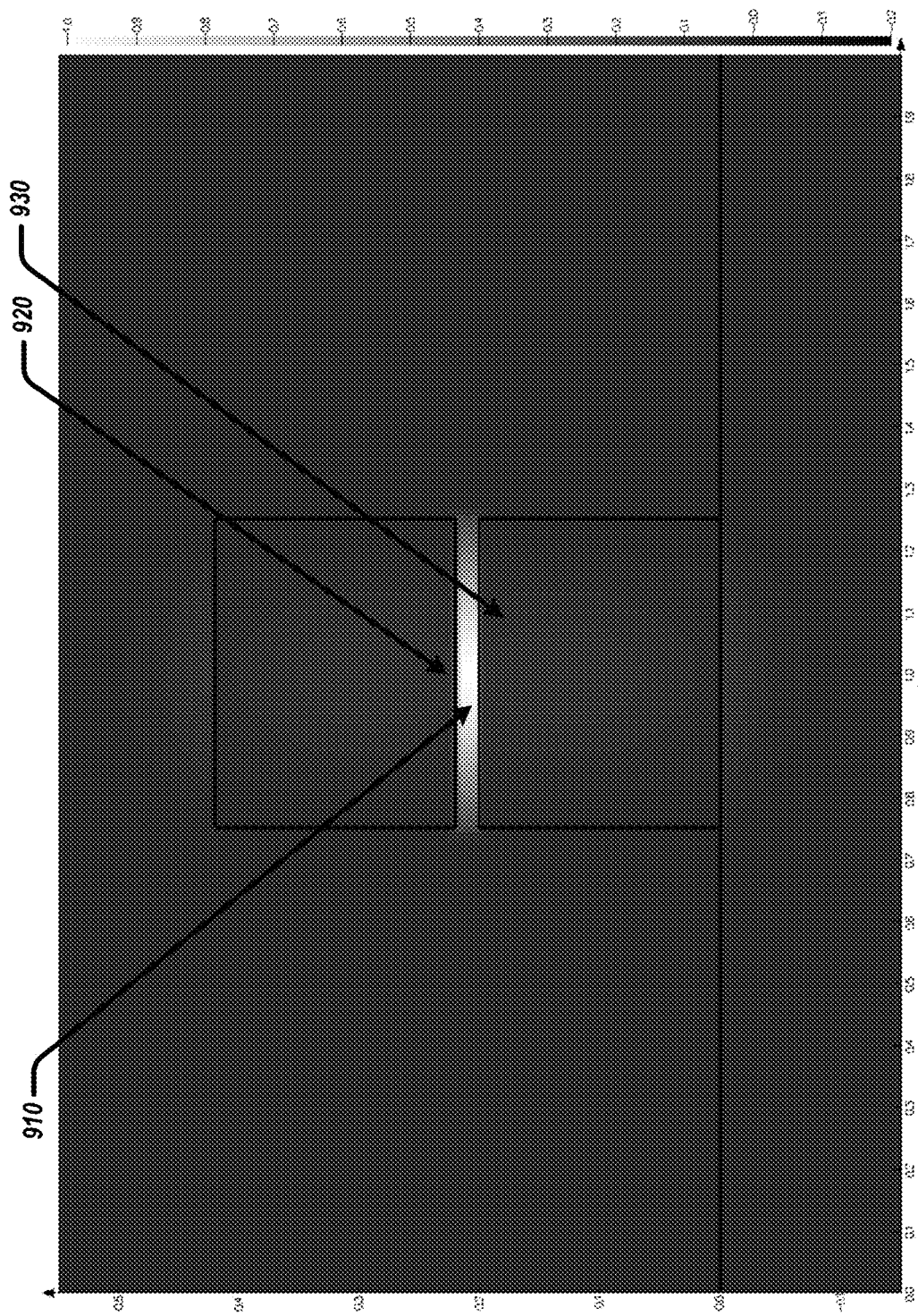
FIG. 9 is an illustration of optical intensity in an example dispersion tuning section.

FIG. 9 is an illustration of electric field (E-field) amplitude in an example dispersion tuning section include a vertical slot waveguide having a slot 910 in between a lower rail 930 and an upper rail 920, such as dispersion tuning section illustrated 600 of FIG. 6, dispersion tuning section illustrated 700 of FIG. 7, and dispersion tuning section illustrated 800 of FIG. 8. The amplitude of the E-field in the illustration may range from low (darker shade) to high (lighter shade). As shown in FIG. 9, the slot waveguide produces a high E-field amplitude and strong E-field confinement in the low-index slot 910 (and thus the optical intensity is greatest in the slot). The electric field in slot 910 may generally run normal (i.e., vertically in the z-axis) to the plane of slot 910.

Figure 10A:
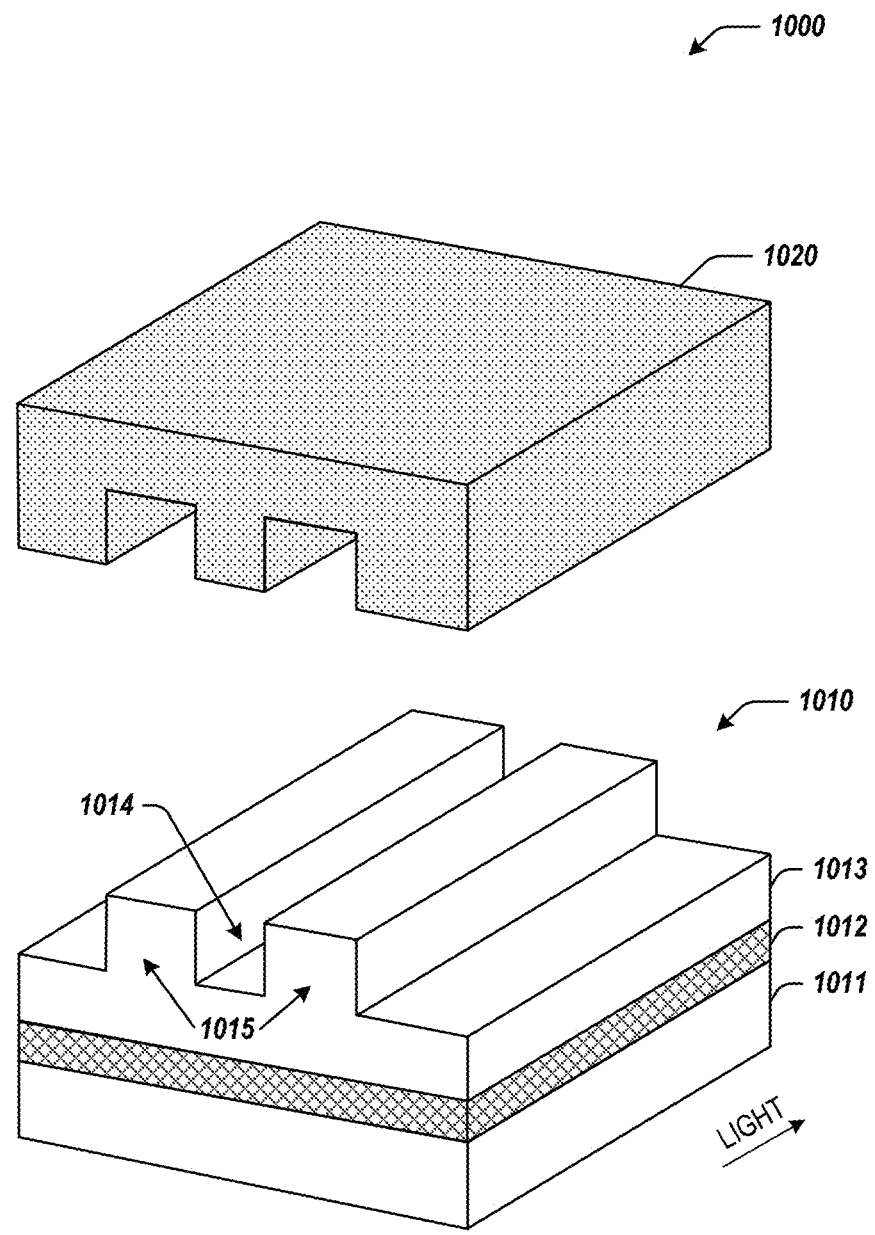
FIGS. 10(a)-10(c) are illustrations depicting an example dispersion tuning section.
Figure 10B:
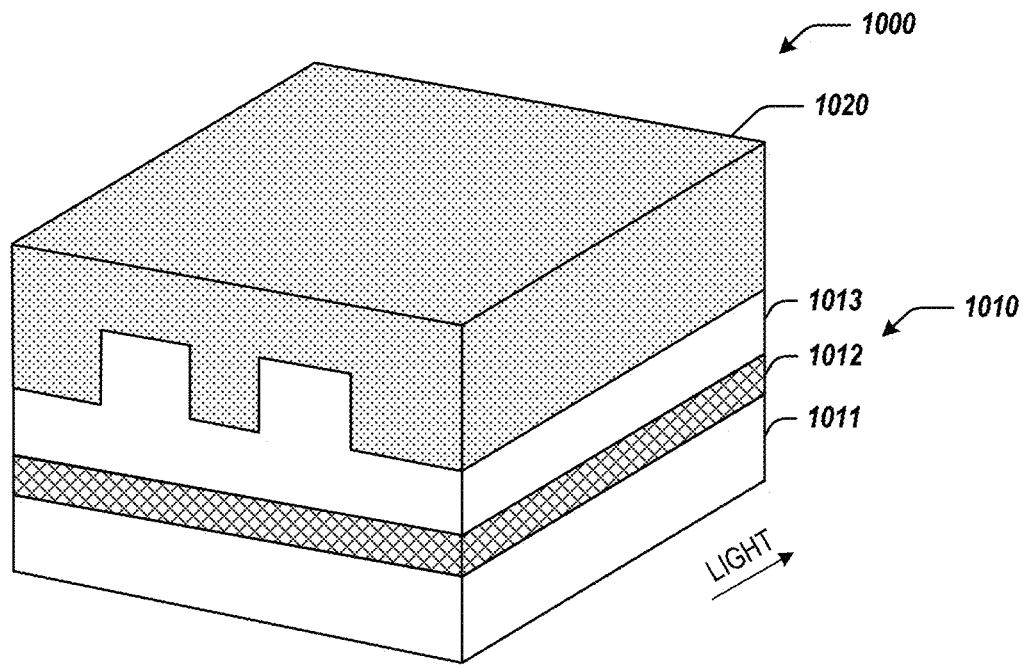
Figure 10C:
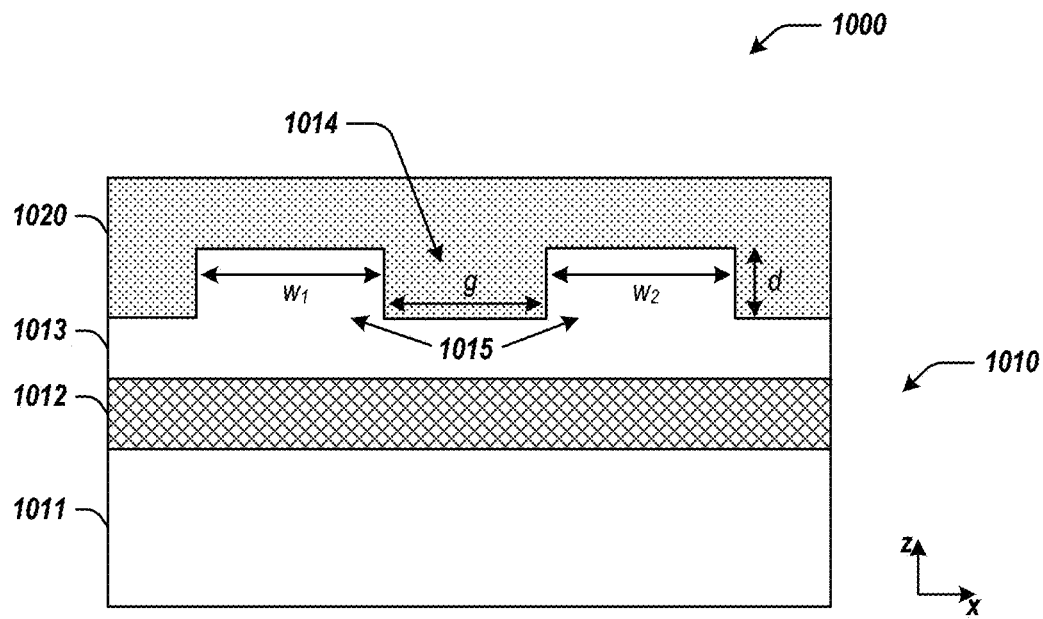

FIGS. 10(a)-10(c) are illustrations depicting an example dispersion tuning section 800. In some implementations, dispersion tuning section 1000 may be used to implement dispersion tuning section 130 of FIG. 1, dispersion tuning section 330 of FIG. 3, dispersion tuning sections 430 and 440 of FIG. 4, and dispersion tuning section 530 of FIG. 5. FIG. 10(a) is an illustration of an exploded perspective view of dispersion tuning section 1000, FIG. 10(b) is an illustration of an assembled perspective view of dispersion tuning section 1000, and FIG. 10(c) is an illustration of a cross-sectional view of dispersion tuning section 1000. As shown in FIGS. 10(a)-10(c), dispersion tuning section 1000 may include a SOI substrate 1010 and a cladding layer 1020.

Dispersion tuning section 1000 may include a horizontal slot waveguide (i.e., a slot waveguide where the low refractive index slot 814 of the slot waveguide is arranged in between a pair of high refractive index rails 815.

As shown in FIGS. 10(a)-10(c), layers 1011, 1012, and 1013 may make up SOI substrate 1010, wherein layer 1011 is a bottom silicon layer, layer 1012 is a BOX layer (e.g., $SiO_2$), and layer 1013 is an upper silicon layer. Rails 1015 may be formed in upper silicon layer 1013, for example, by etching upper silicon layer 1013. Cladding layer 1020 may be deposited above upper silicon layer 1013 and in between rails 1015. Cladding layer 1020 may comprise various low refractive index materials, such as $SiO_2$, $Si_xN_y$, $Al_2O_3$, $TiO_2$, $HfO_2$, etc. Light may travel through the slot waveguide, being mostly confined within cladding layer 1020 in slot 1014.

Dispersion tuning section 1000 may be used to tune TCD in various ways. In one technique, material dispersion of dispersion tuning section 1000 may be tuned by selecting different materials for cladding layer 1020. In another technique, waveguide dispersion may be tuned by adjusting various parameters of dispersion tuning section 1000. In some implementations, one or a combination of techniques may be used to tune TCD.

FIG. 10(c) illustrates various parameters of dispersion tuning section 800 that may be adjusted in order to tune TCD. The parameters may include, for example, the thickness d of rails 1015, the width $w_1$ and $w_2$ of rails 1015, and the width of g of slot 1014. One or a combination of these parameters may be adjusted to tune TCD.

The foregoing disclosure describes a number of example implementations of multi-wavelength semiconductor comb lasers. For purposes of explanation, certain examples are described with reference to the components illustrated in FIGS. 1-5, 6(a)-6(c), 7(a)-7(c), 8(a)-8(c), and 10(a)-10(c). The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Thus, the present disclosure merely sets forth possible examples of implementations, and many variations and modifications may be made to the described examples. All such modifications and variations are intended to be included within the scope of this disclosure and protected by the following claims.

The invention claimed is:

1. A multi-wavelength semiconductor comb laser, comprising:
   a silicon-on-insulator (SOI) substrate comprising a lower silicon layer, a buried silicon oxide layer ($SiO_2$), and an upper silicon layer;
   a first waveguide included in the upper silicon layer of the SOI substrate;
   a quantum dot (QD) active gain region above the first waveguide defining an active section in a laser cavity of the comb laser;
   a dispersion tuning section included in the laser cavity to tune total cavity dispersion of the comb laser, the first waveguide, QD active gain region, and dispersion tuning section forming a ring, the dispersion tuning section comprising a vertical slot waveguide, the vertical slot waveguide comprising a lower rail formed in the upper silicon layer of the SOI substrate having a plurality of widths along a length of the lower rail, a plurality of air gaps, a slot region formed in a dielectric layer above the lower rail, and an upper rail formed in a cladding layer above the dielectric layer,
   wherein the dispersion tuning section is configured to adjust one or more of: a depth of one or more of the plurality of air gaps, one or more of the plurality of widths of the lower rail, a thickness of the dielectric layer, or a thickness of the cladding layer to tune total cavity dispersion of the comb laser, and
   wherein the dispersion tuning section is configured to enable tuning of total cavity dispersion of the comb laser for broad comb operation in a wavelength range of 1.3 µm to 1.6 µm; and
   a second waveguide to couple light into and out of the ring.

2. The multi-wavelength semiconductor comb laser of claim 1, comprising:
   a mirror at a first end of he second waveguide.

3. The multi-wavelength semiconductor comb laser of claim 1, wherein the vertical slot waveguide comprises:
   a silicon oxide layer formed above the dielectric layer; and
   wherein the cladding layer the upper ail is formed in is an epitaxial silicon layer above the silicon oxide layer.

4. The multi-wavelength semiconductor laser comb of claim 1, wherein the lower rail of the vertical slot waveguide is formed between two air gaps, of the plurality of air gaps, in the upper silicon layer.

5. The mufti-wavelength semiconductor comb laser of claim 1, wherein the cladding layer comprises a material, the upper rail formed in the III-V material.

6. The multi-wavelength semiconductor comb laser of claim 1, wherein the dispersion tuning section is included in a passive section of the laser cavity.

* * * * *